(12) United States Patent
Seo et al.

(10) Patent No.: US 6,344,960 B1
(45) Date of Patent: Feb. 5, 2002

(54) ELECTROSTATIC DISCHARGE PROTECTING CIRCUIT FOR SEMICONDUCTOR DEVICE

(75) Inventors: Dong-Hyun Seo, Seoul; Hong-Bae Park, Cheongju, both of (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/457,890

(22) Filed: Dec. 10, 1999

(30) Foreign Application Priority Data

Jul. 28, 1999 (KR) .............................. 99-30919

(51) Int. Cl.[7] .............................................. H02H 3/22
(52) U.S. Cl. .......................... 361/111; 361/56; 361/90; 361/91.1; 361/117
(58) Field of Search .............................. 361/56, 58, 90, 361/91.1, 111, 117–119, 127, 115; 257/173, 355; 327/534, 310, 313, 318, 327, 328

(56) References Cited

U.S. PATENT DOCUMENTS 5,838,050 A  * 11/1998 Ker et al. .................... 257/401

6,166,584 A  * 12/2000 De .............................. 327/534

* cited by examiner

Primary Examiner—Josei Ballato
Assistant Examiner—Vaughn Marquis
(74) Attorney, Agent, or Firm—Morgan, Lewis & Bockius LLP

(57) ABSTRACT

An electrostatic discharge protecting circuit for a semiconductor device is provided and includes a first circuit portion including an N-type MOS field effect transistor formed on a P-type silicon substrate and a P-type MOS field effect transistor formed on an N-type well in the P-type silicon substrate. The electrostatic discharge protecting circuit operates in a normal operating mode and an electrostatic discharge evaluation mode. In the normal operating mode, the N- and P-type MOS transistors operate as an output buffer connected to an internal circuit. In the electrostatic discharge characteristic mode, an electrostatic discharge signal is applied from an external source through a pad and switching devices included in a second portion of the electrostatic discharge protecting circuit connect a bulk terminal of the N-type MOS transistor to a ground voltage, thereby improving electrostatic discharge characteristics of the semiconductor device.

13 Claims, 2 Drawing Sheets

ELECTROSTATIC DISCHARGE PROTECTING CIRCUIT FOR SEMICONDUCTOR DEVICE

BACKGROUND OF THE INVENTION

1. Field of the Invention

The present invention relates to an electrostatic discharge protecting circuit for a semiconductor device, and more particularly to an electrostatic discharge protecting circuit for a semiconductor device in which when an electrostatic discharge signal is applied from an external source through a pad, bulk terminal of an N-type MOS transistor used for an electrostatic discharge protecting circuit is connected to a ground voltage, to thereby improve the electrostatic discharging characteristics.

2. Description of the Background Art

FIG. 1 is a block diagram of a conventional semiconductor device including an electrostatic discharge protecting circuit, which shows a part related to an input/output pad peripheral circuit and an electrostatic discharge protecting circuit in the semiconductor device, including a first block 1 for serving as an output buffer under the control of a first and a second control signals CON1 and CON2 when it performs a normal memory operation upon being connected to an internal circuit, and serving as an electrostatic discharge protecting circuit when it performs an evaluation of electrostatic discharge characteristics; a pad 2 for receiving an electrostatic discharge signal ESDS; a second block for serving as an electrostatic discharge protecting circuit according to the electrostatic discharge signal ESDS inputted to the pad 2; and an internal circuit 4 (i.e., an input buffer) for receiving an output signal from the first block 1 as inputted to the pad 2.

The first block 1 includes a first PMOS transistor PM11, connected in serial to a power supply voltage VCC and a ground voltage VSS, having a gate to which a first control signal CON1 is applied and a bulk commonly connected to a source thereof to which a power supply voltage VCC is applied; and a first NMOS transistor NM11, connected in serial to the power supply voltage VCC and a ground voltage VSS, having a gate to which a second control signal CON2 is applied, a bulk to which a back bias voltage VCC is applied or floated and a source connected to the ground voltage VSS. A drain commonly connected to the first PMOS transistor PM11 and the first NMOS transistor NM11 acts as an output terminal.

The second block 3 includes a second PMOS transistor PM12, connected in serial between a power supply voltage VCC and a ground voltage VSS and a gate, having a gate, a source and a bulk commonly connected to which the power supply voltage VCC is applied; and a second NMOS transistor, connected in serial between the power supply voltage VCC and the ground voltage VSS, having a gate and a source commonly connected to be connected to the ground power source VSS and a bulk to which a back bias voltage VBB is applied or floated. A drain commonly connected to the second PMOS transistor and a NMOS transistor acts as an input terminal and an output terminal.

An operation of the conventional electrostatic discharge protecting circuit for a semiconductor device as constructed above will now be described.

When the above-described circuit is connected to an internal circuit to perform a normal operation, the first block 1 works as a buffer. That is, the first control signal CON1 applied to the gate of the first PMOS transistor PM11 turns a pull-up signal PUP, the second control signal CON2 applied to the gate of the first NMOS transistor NM11 turns a pull-down signal PDN, and the back bias voltage VBB is applied to the bulk of the first NMOS transistor. At this time, the transistors PM12 and NM12 of the second block 3 are turned off not to be operated.

Meanwhile, in order to evaluate electrostatic discharge characteristics, in general, a terminal of the ground voltage VSS is connected to a ground GND and a higher voltage than the power supply voltage VCC and a lower voltage than a minus power supply voltage −VCC are respectively applied to a pad 2. And then, after a power supply voltage terminal is connected to the ground GND, a high voltage than the power supply voltage VCC and a lower voltage than the minus power supply voltage −VCC are respectively applied to the pad 2.

Regarding the conventional electrostatic discharge protecting circuit of FIG. 1, when it is performed to evaluate the electrostatic discharge characteristics, the first block 1 works as the electrostatic discharge protecting circuit. That is, the gates of the first PMOS transistor 11 and the first NMOS transistor NM11 are floated, and the bulk of the first NMOS transistor NM11 is also floated.

In detail, when the ground voltage VSS terminal is connected to the ground GND and an electrostatic discharge signals ESDS, that is, the higher voltage than the power supply voltage VCC and the lower voltage than the minus power supply voltage−VCC, are respectively applied to the pad 2, the electrostatic discharge signal ESCS is discharged to the ground voltage VSS terminal by an operation of the N-P-N parasitic bipolar transistor of the first and the second NMOS transistors NM11 and NM12.

And, when the power supply voltage (VCC) terminal is connected to the ground and the electrostatic discharge signals ESDS, that is, the higher voltage than the power supply voltage VCC and the lower voltage than the minus power supply voltage −VCC, are respectively applied to the pad 2, the electrostatic discharge signal ESDS is discharged to the power supply voltage VCC terminal by a forward direction operation of a P+N-well parasitic diode existing between the first and the second PMOS transistors PM11 and PM12 and a P-type substrate and N-well and a parasitic bipolar transistor of the first and the second PMOS transistors PM11 and PM12.

In this connection, in order to be evaluated as a normal product, a leak current caused by the electrostatic discharge signal ESDS of the first and second PMOS transistor PM11 and PM12 and the first and second NMOS transistor NM11 and NM12 must be below a reference value, and the electrostatic discharge signal much be enough discharged.

However, as to the conventional art, in the evaluation of the electrostatic discharge characteristics, the P-type bulk terminal is floated without being connected to the ground voltage VSS. Accordingly, in case that the ground voltage VSS terminal is connected to the ground, if a lower electrostatic discharge signal than the minus power supply voltage is applied thereto, the electrostatic discharge signal is discharged only by the N-P-N parasitic bipolar transistor, failing to perform the forward-direction function of the n+/p parasitic diode, which causes a deterioration of the electrostatic discharge characteristics.

SUMMARY OF THE INVENTION

Therefore, an object of the present invention is to provide an electrostatic discharge protecting circuit in which when an electrostatic discharge signal, a minus voltage at the reference of a ground voltage VSS, is applied, bulk terminals of each NMOS transistor are controlled to be connected to the ground voltage VSS which adds a forward-direction function of an n+/p parasitic diode, to thereby improve an electrostatic discharge characteristics.

To achieve these and other advantages in accordance with the purpose of the present invention, as embodied and broadly described herein, there is provided an electrostatic discharge protecting circuit for a semiconductor device including a first block for serving as an output buffer under the control of a first and a second control signals when it is desired to perform a normal operation by being connected to an internal circuit, and serving as an electrostatic discharge protecting circuit by connecting a bulk of a P-type transistor to a power supply unit and a bulk of a N-type transistor to a ground voltage when it is desired to perform an electrostatic discharge characteristics evaluation; a pad for receiving the output from the first block or the electrostatic discharge signal; and a second block for serving as an electrostatic discharge protection circuit for evaluating the electrostatic discharge characteristics according to the electrostatic discharge signal inputted to the pad, for which a bulk of the P-type transistor is connected to the power supply voltage and a bulk of the N-type transistor is connected to the ground voltage.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
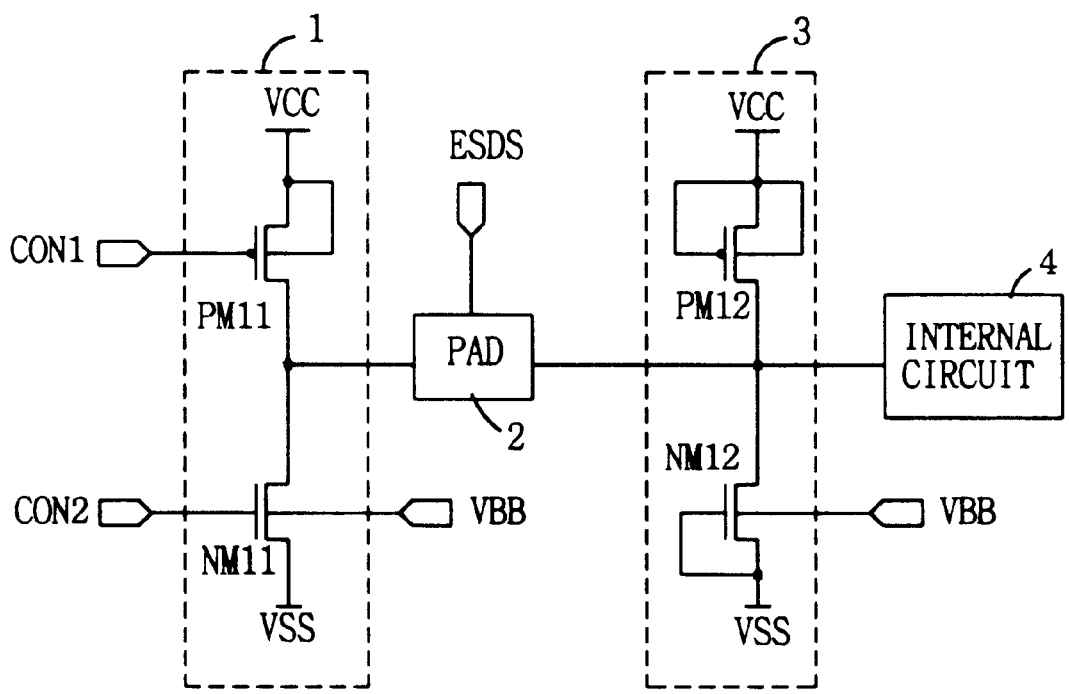
FIG. 1 is a block diagram of a conventional electrostatic discharge protecting circuit for a semiconductor device.
Figure 2:
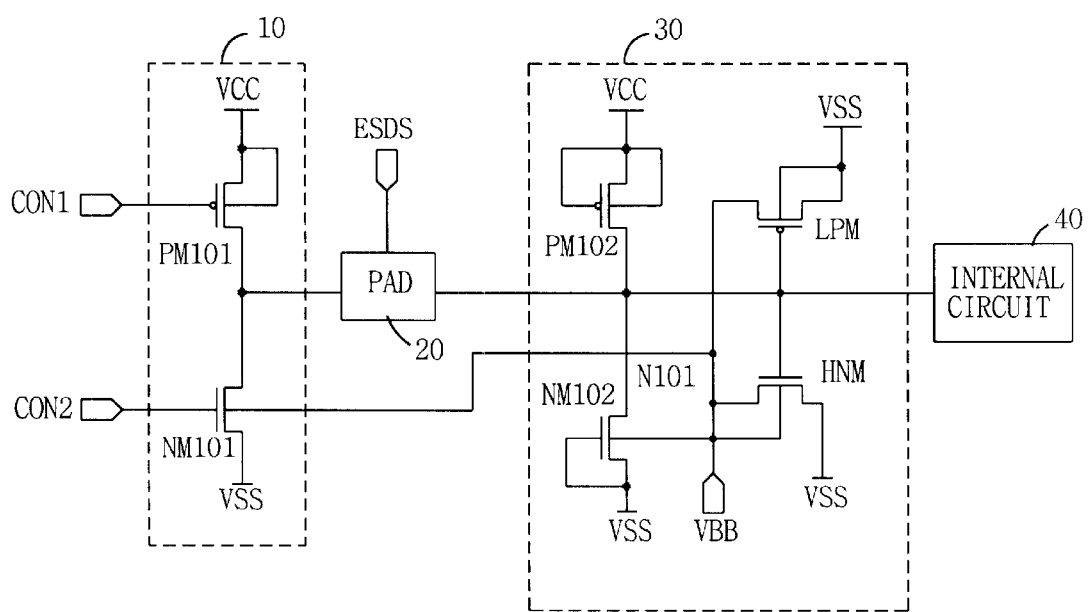
FIG. 2 is a block diagram of an electrostatic discharge protecting circuit for a semiconductor device in accordance with the present invention.

Reference will now be made in detail to the preferred embodiments of the present invention, examples of which are illustrated in the accompanying drawings. FIG. 2 is a block diagram of a semiconductor device including an electrostatic discharge protecting circuit. As shown herewith is a related part of an input/output pad peripheral circuit and an electrostatic discharge protecting circuit, including a first block 10 for serving as an output buffer under the control of a first and a second control signals CON1 and CON2 when a normal operation is performed upon being connected to an internal circuit, and serving as an electrostatic discharge protecting circuit when an electrostatic discharge characteristics evaluation is performed; a pad 20 for receiving the output of the first block 10 or an electrostatic discharge signal ESD; a second block 30 for serving as the electrostatic discharge protecting circuit of which the electrostatic discharge characteristics are evaluated by the electrostatic discharge signal ESDS inputted to the pad; and an internal circuit (i.e., an input buffer) for receiving an output signal from the first block 10 as inputted to the pad 20.

The first block 10 includes a first PMOS transistor PM101, connected in serial between a power supply voltage VCC and a ground voltage VSS, having a gate to which a first control signal is applied, and a bulk and a source commonly connected to which a power supply voltage VCC is applied; a first NMOS transistor NM101, connected in serial between the power supply voltage VCC and a ground voltage VSS, having a gate to which a second control signal CON2 is applied, a source connected to the ground voltage VSS, and a bulk connected to a first node N101. A drain commonly connected to the first PMOS transistor and the first NMOS transistor acts as an output terminal.

The second block 30 includes a second PMOS transistor PM102, connected in serial between the power supply voltage VSS and the ground voltage VSS, having a gate, a source and a bulk commonly connected to which the power supply voltage VCC is applied; a second NMOS transistor NM102, also connected in serial between the power supply voltage VSS and the ground voltage VSS, having a gate and a source commonly connected to which the ground voltage VSS is connected, and a bulk connected to the first node N101; a low threshold voltage PMOS transistor LPM having a gate to which the output from the pad 20 is applied, a source and a bulk commonly connected to which the ground voltage is connected, and a drain connected to the first node N101; and a high threshold voltage NMOS transistor HNM having a gate to which the output from the pad 20 is applied, a source connected to the ground voltage VSS, and a drain and a bulk commonly connected to be connected to the first node N101. A drain commonly connected to the second PMOS transistor PM02 and the second NMOS transistor NM102 acts as both an input terminal and an output terminal.

In this respect, the threshold voltage of the high threshold voltage NMOS transistor HNM is higher than the power supply voltage VCC, and the threshold voltage of the low threshold voltage PMOS transistor LPM is lower than a minus power supply voltage −VCC.

The low threshold voltage PMOS transistor LPM is formed on an N-type well which is formed on a P-type silicon substrate.

When the above-state circuit is connected to an internal circuit to perform a normal operation, a back bias voltage VBB is applied to the first node N101, and when it performs for an electrostatic discharge characteristics evaluation, the back bias voltage is not applied.

An operation of the electrostatic discharge protecting circuit as constructed above will now be described.

First, when the above-stated circuit is connected to the internal circuit to perform a normal operation, the first block 10 serves as an output buffer. That is, the first control signal CON1 applied to the gate of the first PMOS transistor PM101 turns a pull-up signal PUP, while the second control signal CON2 applied to the gate of the first NMOS transistor NM101 turns pull-down signal PDN. And, a back bias voltage VBB is applied to the bulk of the first NMOS transistor NM101 through the first node N101.

At this time, all the transistors PM102, LPM, NM102 and HNM of the second block 3 are turned off and not operated.

Meanwhile, when the electrostatic discharge characteristics is evaluated, the first block 1 serves as an electrostatic discharge protecting circuit. That is, the first and the second control signals CON1 and CON2 are all floated.

In detail, when the ground voltage VSS terminal is connected to a ground GND and an electrostatic discharge signal ESDS is applied thereto, the instant the electrostatic discharge signal reaches the gate threshold voltage of the high threshold voltage NMOS transistor after exceeding the power supply voltage VCC, a high threshold voltage NMOS transistor HNM is turned on and the bulk terminal of the first and the second NMOS transistors NM101 and NM102, that is, a P-type substrate terminal, is connected to the ground voltage VSS through the high threshold voltage NMOS transistor HNM. Meanwhile, the instant the electrostatic discharge signal ESDS reaches a lower voltage than a minus power voltage −VCC, that is, the gate threshold voltage of the low threshold voltage PMOS transistor LPM, the low threshold voltage PMOS transistor LPM is turned on and the bulk terminal of the first and the second NMOS transistor NM101, NM102, that is, the P-type substrate terminal, is connected to the ground voltage VSS. Accordingly, when the electrostatic discharge signal ESOS either exceeding the power supply voltage VCC or lower than the minus power supply voltage −VCC is applied, since the bulk terminal of the first and the second NMOS transistor NM101 and NM102 is connected to the ground voltage VSS, the first and the second NMOS transistors NM101 and NM102 are connected to diode, so that the electrostatic discharge signal can be speedily discharged in the forward direction of the diode.

Also, when the power supply voltage VCC terminal is connected to the ground GND and the electrostatic discharge signal ESDS is applied thereto, the instant the electrostatic discharge signal ESDS reaches the gate threshold voltage of the high threshold voltage NMOS transistor HNM after exceeding the power supply voltage VCC, the high threshold voltage NMOS transistor HNM is turned on and the first and the bulk terminal of the second NMOS transistor NM101 and NM102, that is, the P-type substrate terminal, is connected to the ground voltage VSS through the high threshold voltage NMOS transistor HNM. Meanwhile, the instant the electrostatic discharge signal ESDS reaches a voltage lower than the minus power supply voltage −VCC, that is, the gate threshold voltage of the low threshold voltage PMOS transistor LPM, the low threshold voltage PMOS transistor LPM is turned on and the bulk terminal of the first and the second NMOS transistor NM101 and NM102, that is, the P-type substrate terminal is connected to the ground voltage VSS.

Accordingly, when the electrostatic discharge signal ESDS either exceeding the power supply voltage or lower than the minus power supply voltage−VCC is applied, since the bulk terminal of the first and the second NMOS transistor NM101 and NM102 is connected to the ground voltage VSS, the first and the second NMOS transistors NM101 and NM102 are connected to the diode so that the electrostatic discharge signal ESDS can be applied to the power supply voltage VCC by the forward-directional operation of the diode and the operation of the parasitic bipolar transistor of the first and the second PMOS transistors, resulting in that discharging can be speedily performed.

As so far described, in the electrostatic discharge protecting circuit for a semiconductor device according to the present invention, in case where the NMOS transistor is formed on the P-type silicon substrate and the PMOS transistor is formed on the N-type well formed on the P-type silicon substrate, the bulk terminal of the NMOS transistor is connected to the ground voltage VSS when the electrostatic discharge signal for electrostatic discharge characteristics evaluation has either a higher value than the power supply voltage VCC or a lower value than the minus power supply voltage−VCC by using the NMOS transistor of which the gate threshold voltage is higher than the power supply voltage VCC and the PMOS transistor of which the gate threshold voltage is lower than the minus power supply voltage−VCC, thereby improving the electrostatic discharge effectiveness.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An electrostatic discharge protecting circuit for a semiconductor device, comprising:
    a first circuit block connected to an internal circuit including a first NMOS transistor and a first PMOS transistor, the first PMOS transistor including a bulk region connected to a first power supply voltage terminal for applying a power supply voltage, and a source of the first NMOS transistor connected to a second power supply voltage terminal for applying a second power supply voltage;
    a pad for receiving output from the first circuit block; and
    a second circuit block connected to the pad and including switching devices, wherein the semiconductor device is operable in a normal operation mode and a electrostatic characteristics evaluation mode, wherein
    in the normal operating mode, the first and second power supply voltages are respectively applied to the first and second power supply voltage terminals, the first circuit block connects to the internal circuit and operates as an output buffer under the control of first and second control signals, and the switching devices of the second circuit block remain in an off state, and
    in the electrostatic characteristics evaluation mode, at least one of the switches of the second circuit block turns on to connect a bulk terminal of at least the first NMOS transistor to a ground voltage in response to a voltage of an electrostatic discharge signal applied to the pad that exceeds a threshold voltage of the at least one of the switches of the second circuit block.

2. The circuit according to claim 1, wherein the switching devices of the second circuit block comprise:
    a second PMOS transistor connected in series between the first power supply voltage terminal and the second power voltage supply terminal, the second PMOS transistor including a gate, a source and a bulk terminal commonly connected to which the first power supply voltage is applied in the normal operating mode;
    a second NMOS transistor also connected in series between the first power supply voltage terminal and the second power supply voltage terminal, the second NMOS transistor including a gate and a source commonly connected to second power supply terminal, and a bulk region connected to a first node, wherein a drain of the second PMOS transistor commonly connects with a drain of the second NMOS transistor to form both an input terminal and an output terminal;
    a low threshold voltage third PMOS transistor having a gate to which output from the pad is applied, a source and a bulk region commonly connect to the second power supply voltage terminal, and a drain connected to the first node; and
    a high threshold voltage third NMOS transistor including a gate to which the output from the pad is applied, a source connected to the second power supply voltage terminal, and a drain and a bulk region commonly connected to the first node.

3. The circuit according to claim 2, wherein the high threshold voltage of the third NMOS transistor is higher than the first power supply voltage.

4. The circuit according to claim 2, wherein the lower threshold voltage of the third PMOS transistor is lower than a negative value of the first power supply voltage.

5. The circuit according to claim 2, wherein a back bias voltage is applied to the bulk region of the second NMOS transistor only when the electrostatic discharge protecting circuit is connected to the internal circuit in the normal operating mode.

6. The circuit according to claim 1, wherein the first PMOS transistor is connected in series between the first power supply voltage terminal and the second power voltage supply terminal, the first PMOS transistor including a gate to which the first control signal is applied in the normal operation mode and a source commonly coupled with the bulk region of the first PMOS transistor, the first NMOS transistor also being connected in series between the first power supply voltage terminal and the second power supply voltage terminal, the NMOS transistor including a gate to which a second control signal is applied in the normal operation mode, a source connected to the second power supply voltage terminal, and a bulk region connected to a first node, and a drain of the first PMOS transistor and a drain of the first NMOS transistor being commonly connected to form a second node connected to the pad.

7. The circuit according to claim 6 or 2, wherein a back bias voltage is applied to the bulk region of the first NMOS transistor only when the electrostatic discharge protecting circuit is connected to the internal circuit in the normal operating mode.

8. The circuit according to claim 1 or 6, wherein the first control signal is a pull-up signal.

9. The circuit according to claim 1 or 6, wherein the second control signal is a pull-down signal.

10. The circuit according to claim 1, wherein in the electrostatic characteristics evaluation mode the voltage of the electrostatic discharge signal applied to the pad that exceeds a threshold voltage of the at least one of the switching devices of the second circuit block has an absolute value greater than the first power supply voltage.

11. The circuit according to claim 1, wherein in the electrostatic characteristics evaluation mode a second one of the switching devices of the second circuit block includes a bulk region that switches to the ground voltage when a voltage of an electrostatic discharge signal applied to the pad exceeds a threshold voltage of the at least one of the switching devices of the second circuit block.

12. The circuit according to claim 11, wherein a back bias voltage is applied to the bulk region of the second one of the switching devices only when the electrostatic discharge protecting circuit is connected to the internal circuit in the normal operating mode.

13. The circuit according to claim 1 or 6, wherein the first and the second control signals are floated in the electrostatic discharge characteristics evaluating mode.

* * * * *